United States Patent
Sano et al.

(10) Patent No.: US 6,407,405 B1
(45) Date of Patent: Jun. 18, 2002

(54) P-TYPE GROUP II-VI COMPOUND SEMICONDUCTOR CRYSTALS GROWTH METHOD FOR SUCH CRYSTALS, AND SEMICONDUCTOR DEVICE MADE OF SUCH CRYSTALS

(75) Inventors: Michihiro Sano, Odawara; Takafumi Yao, c/o Metallic Material Research Laboratory Tohoku University 2-1-1 Katahira, Aoba-ku Sendai-shi, Miyagi, both of (JP)

(73) Assignees: Stanley Electric Co., Ltd., Tokyo (JP); Takafumi Yao, Sendai (JP)

( * ) Notice: Subject to any disclaimer, the term of this patent is extended or adjusted under 35 U.S.C. 154(b) by 0 days.

(21) Appl. No.: 09/573,245

(22) Filed: May 18, 2000

(30) Foreign Application Priority Data

May 21, 1999 (JP) ............................. 11-142059

(51) Int. Cl.$^7$ .............................................. H01L 29/06
(52) U.S. Cl. ............................. 257/15; 257/18; 257/22; 257/85; 257/102; 257/103; 438/102
(58) Field of Search .............................. 257/15, 18, 21, 257/22, 23, 85, 102, 103; 438/102; 117/108

(56) References Cited

U.S. PATENT DOCUMENTS 6,087,725 A  * 11/2000  Yoshii et al. ................ 257/744
6,169,296 B1 *  1/2001  Kamiyama et al. ........... 257/94

FOREIGN PATENT DOCUMENTS

EP          0 702 101         3/1996

OTHER PUBLICATIONS

T. Takeda et al., "Atomic Layer Epitaxy of ZnSe and ZnTe Single Crystalline Films and Its Application to the Fabrication of ZnSe/ZnTe Superlattices", *Japanese Journal of Applied Physics, Extended Abstracts of the 17th Conference*, Solid State Devices and Materials, (1985), pp. 221–224, XP002146136, Japan Society of Applied Physics, Tokyo, Japan.

Patent Abstracts of Japan, vol. 012, No. 154 (P–700), May 12, 1988, of JP 62–270927A, (Fujitsu Ltd.), Nov. 25, 1987.

Patent Abstracts of Japan, vol. 018, No. 656 (C–1286), Dec. 13, 1994, of JP 06–256760A, (Olympus Optical Co. Ltd.), Sep. 13, 1994.

Patent Abstracts of Japan, vol. 1995, No. 10, Nov. 30, 1995, of JP 07–193001A (Matsushita Electric Ind. Co. Ltd.), Jul. 28, 1995.

* cited by examiner

*Primary Examiner*—Sara W. Crane
(74) *Attorney, Agent, or Firm*—Frishauf, Holtz, Goodman & Chick, P.C.

(57) ABSTRACT

A method of growing p-type group II-VI compound semiconductor crystals, includes a step of forming ZnO layers and ZnTe layers alternately on a ZnO substrate, the ZnO layer being not doped with impurities and having a predetermined impurity concentration, and the ZnTe layer being doped with p-type impurities N to a predetermined impurity concentration or higher.

15 Claims, 5 Drawing Sheets

P-TYPE GROUP II-VI COMPOUND SEMICONDUCTOR CRYSTALS GROWTH METHOD FOR SUCH CRYSTALS, AND SEMICONDUCTOR DEVICE MADE OF SUCH CRYSTALS

This application is based on Japanese Patent Application HEI 11-142059, filed on May 21, 1999, the entire contents of which are incorporated herein by reference.

BACKGROUND OF THE INVENTION a) Field of the Invention

The present invention relates to p-type group II-VI compound semiconductor crystals, its growth method, and semiconductor devices made of such crystals.

b) Description of the Related Art

Most of element semiconductors such as Si and Ge and group III-V compound semiconductors such as GaAs can be given n- or p-type conductivity by doping donor or acceptor impurities.

The nature capable of forming semiconductors of both n- and p-types is called bipolar. If group III-V compound semiconductor is used, p- and n-type semiconductors can be formed on the same substrate. By using group III-V compound semiconductor, semiconductor devices having a p-n junction such as light emitting diodes (LED) can be manufactured.

A forbidden bandwidth (bandgap: Eg) is a value specific to crystal.

A light emission wavelength λ is generally expressed by the following equation.

$$\lambda = 1240/Eg$$

where λ is a light emission wavelength (nm) and Eg (eV) is a forbidden bandwidth of semiconductor.

The value Eg determines the wavelength of inter-band emission light of crystal, i.e., an emission light color. Of group III-V compound semiconductor, GaAs having a relatively narrow Eg has a forbidden bandwidth Eg of 1.43 eV. The emission light wavelength of GaAs is 870 nm in the infrared range. Of group III-V compound semiconductor, AIP having a relatively broad Eg has a forbidden bandwidth Eg of 2.43 eV. The emission light wavelength of AIP is 510 nm which is green emission.

Most of group II-VI compound semiconductor have Eg larger than that of group II-V compound semiconductor. Therefore, light emission can be expected from blue to royal purple and to a ultraviolet range.

Generally, group II-VI compound semiconductor has high ionicity and is mono-polar. Namely, crystals of group II-VI compound semiconductor have generally only one of n- and p-type conductivities and crystals having both conductivities are rare.

Such mono-polar behavior can be explained by self-compensation.

For example, in group II-VI compound semiconductor crystals ZnS, a void of S negative ion having a smaller size has a smaller coupling energy than that of Zn positive ion having a larger size. The effect that Zn positive ion voids compensate p-type impurities is distinctive, and p-type ZnS is hard to be manufactured. Although the self-compensation effect changes with the type of group II-VI compound semiconductor, the phenomenon that p-type ZnO is hard to be manufactured can also be explained in the manner similar to ZnS. If p-type ZnO crystals can be obtained easily, various semiconductor devices using ZnO can be manufactured.

SUMMARY OF THE INVENTION

It is an object of the present invention to provide p-type group II-VI compound semiconductor crystals, more specifically a method of growing p-type ZnO crystals.

It is another object of the present invention to provide p-type group II-VI compound semiconductor crystals, more specifically p-type ZnO crystals and semiconductor devices using such crystals.

In this specification, material containing ZnO as its host element and ZnTe as its dopant or guest element is described simply as ZnO.

According to one aspect of the present invention, there is provided a method of growing p-type group II-VI compound semiconductor crystals, comprising a step of: forming ZnO layers and ZnTe layers alternately on a substrate, the ZnO layer being not doped with impurities and having a predetermined impurity concentration, and the ZnTe layer being doped with p-type impurities N to a predetermined impurity concentration or higher.

According to another aspect of the present invention, there is provided a p-type group II-VI compound semiconductor crystalline material, comprising: a lamination structure of ZnO layers and ZnTe layers alternately stacked on a substrate, wherein N is doped at least in the ZnTe layer.

According to another aspect of the present invention, there is provided a group II-VI compound semiconductor device comprising: a substrate; an n-type group II-VI compound semiconductor layer doped with group III elements and formed on the substrate; and a p-type group II-VI compound semiconductor layer formed on the substrate and having ZnO layers and ZnTe layers alternately laminated, N being doped at least in the ZnTe layer.

As above, p-type ZnO having good crystallinity and small electrical resistance can be grown.

DETAILED DESCRIPTION OF THE PREFERRED EMBODIMENTS

Embodiments of the invention will be described with reference to the accompanying drawings.

With reference to FIGS. 1 to FIGS. 3A and 3B, a method of growing group II-VI compound semiconductor crystals according to the first embodiment of the invention will be described.

Figure 1:
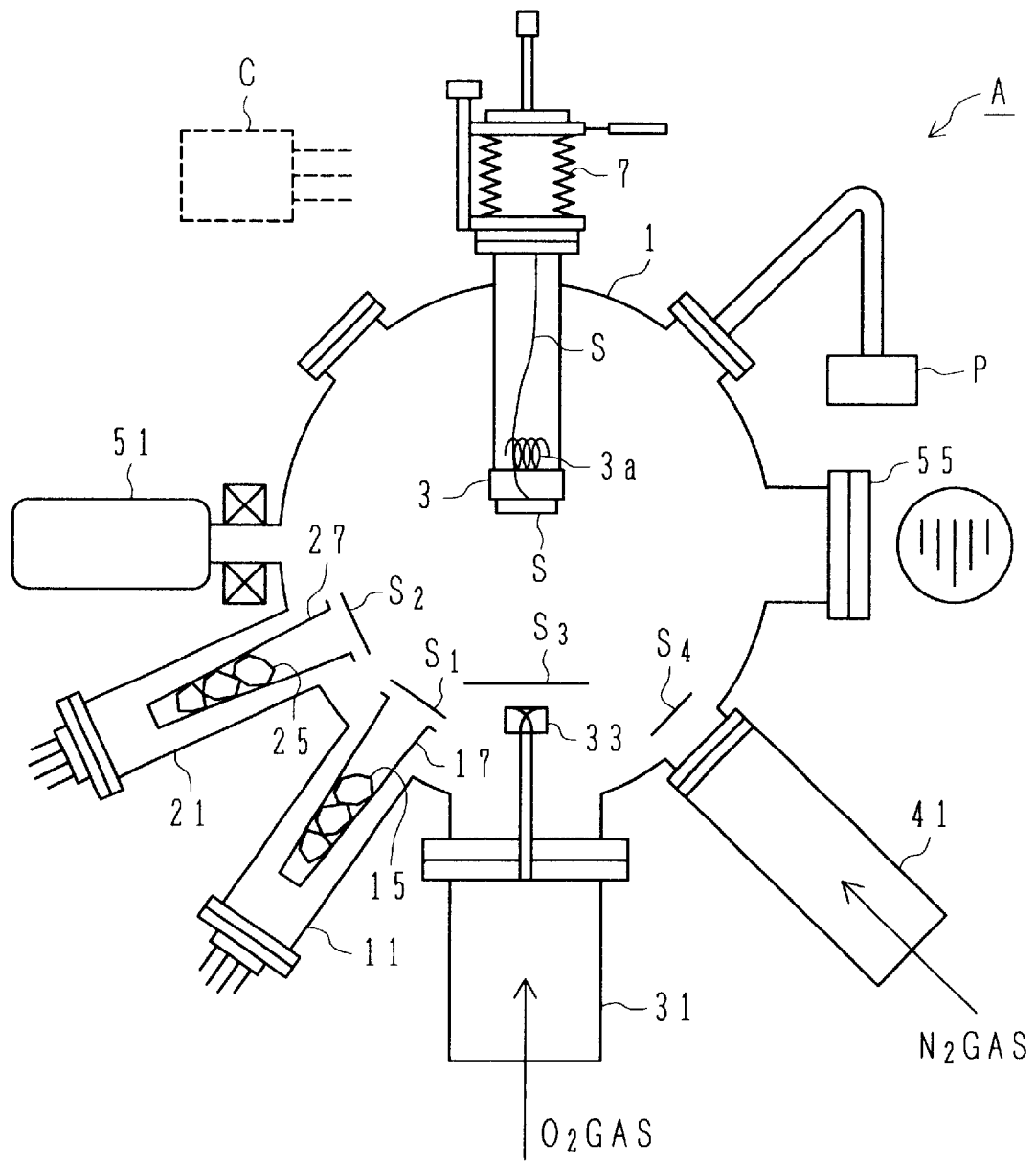
FIG. 1 is a schematic cross sectional view showing the outline of an MBE apparatus used with a crystal growth method according to a first embodiment of the invention.

FIG. 1 shows a crystal growth apparatus using molecular beam epitaxy (MBE) (hereinafter called an "MBE apparatus"), as one example of apparatuses for growing group II-VI compound semiconductor crystals.

This MBE apparatus A has a chamber 1 in which crystals are grown and a vacuum pump 2 for maintaining the inside of the chamber 1 at a ultra high vacuum.

The chamber 1 has a Zn port 11 for evaporating Zn, a Te port 21 for evaporating Te, an O radical port 31 for irradiating O radical, and an N radical port 41 for irradiating N radical Te.

The Zn port 11 has a shutter $S_1$ and a Knudsen cell (hereinafter called a K cell) 17 for accommodating a Zn (purity 7N) source 15 and heating and evaporating Zn. The Te port 21 has a shutter $S_2$ and a K cell 27 for accommodating a Te (purity 6N) source 25 and heating and evaporating Te.

The O radical port 31 jets out O radical into the MBE chamber 1, the O radical being generated from oxygen gas introduced as source gas into an electrodeless discharge tube, by using a radio frequency (13.56 MHz). A shutter $S_3$ is provided for an O radical beam.

The N radical port 41 jets out N radical into the MBE chamber 1, the N radical being generated from nitrogen gas introduced as source gas into an electrodeless discharge tube, by using a radio frequency (13.56 MHz). A shutter $S_4$ is alto provided for an N radical beam.

In the chamber 1, a substrate holder 3 and a heater 3a are installed. The substrate holder 3 holds an underlie substrate S used for crystal growth, and the heater 3 heats the substrate holder 3. A temperature of the substrate S can be measured with a thermo couple 5. The position of the substrate holder 3 can be changed by a manipulator 7 using bellows.

The chamber 1 also has a reflective high energy electron diffraction (RHEED) gun 51 and an RHEED screen 55 provided for monitoring a grown crystal layer. By using the RHEED gun 51 and RHEED screen 55, crystals can be grown while the state (growth quantity and grown crystal layer quality) of crystal growth in the MBE apparatus A is monitored.

A controller C can properly control a crystal growth temperature, a grown crystal layer thickness, a vacuum degree in the chamber, and the like.

Processes of growing p-type ZnO on a ZnO substrate will be described in detail.

All crystal growth is executed by MBE.

A beam quantity of Zn is $1.5 \times 10^{-7}$ Torr, and a Te beam quantity is $4.5 \times 10^{-7}$ Torr.

As an oxygen beam source, an oxygen RF plasma source is used. O radical is generated from pure oxygen (purity 6N) introduced in to the O radical port 31, by using an RF oscillator.

As a nitrogen beam source, a nitrogen RF plasma source is used. N radical is generated from pure nitrogen (purity 6N) introduced in to the N radical port 41, by using an RF oscillator.

In the O radical port 31, the flow of oxygen gas is set to 2 ccm and the pressure thereof is set to $8 \times 10^{-5}$ Torr. In the N radical port 41, the flow of nitrogen gas is set to 0.03 ccm and the pressure thereof is set to $2 \times 10^{-6}$ Torr. The growth temperature is set to 600° C.

These pressure values were measured with a nude ion gauge mounted at the substrate holder position (growth position).

The unit "ccm" used for the flow rate of gas source is a flow rate at 25° C. at one atmospheric pressure, as well known.

Figure 2:
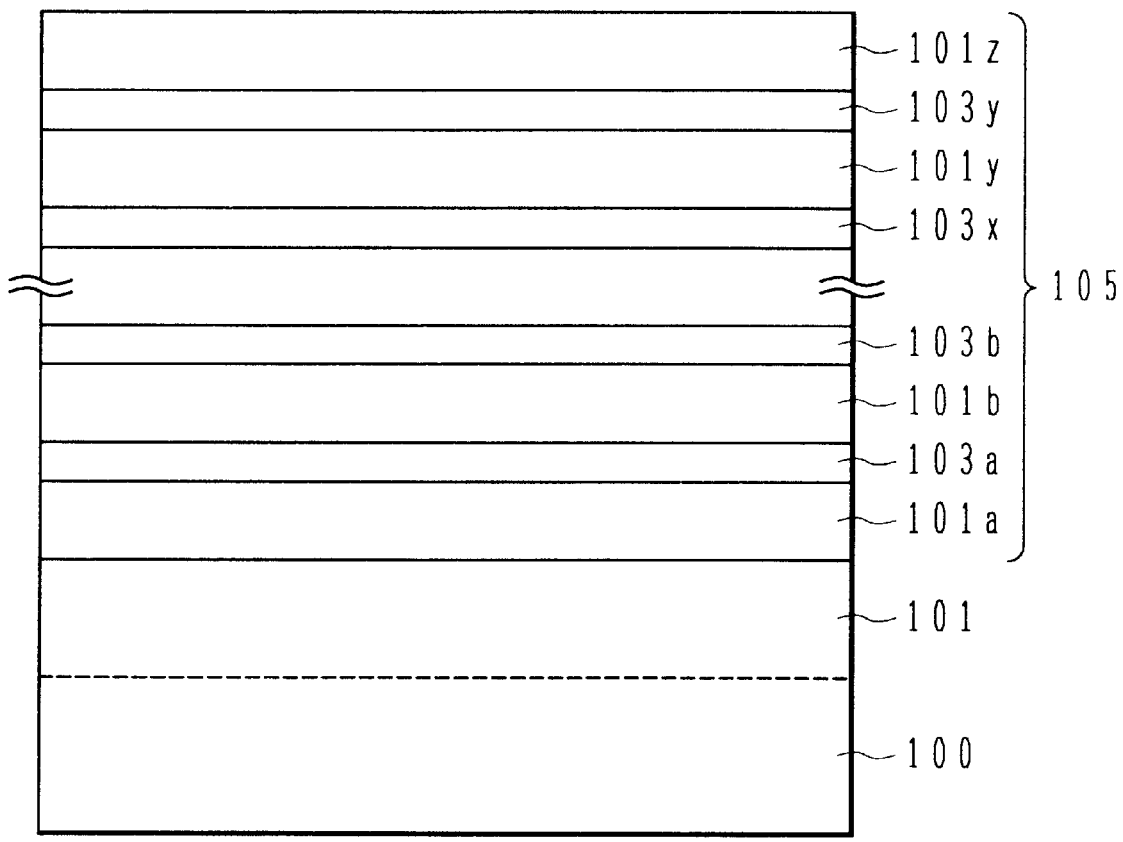
FIG. 2 is a cross sectional view showing the superlattice structure of ZnO—N-doped ZnTe grown by the crystal growth method of the first embodiment of the invention.

FIG. 2 is a cross sectional view of p-type ZnO crystal layers grown by the embodiment method. On a ZnO substrate 100, a superlattice layer 105 made of non-doped ZnO layers and N-doped ZnTe layers is grown. More specifically, the non-doped ZnO layer contains impurities smaller than a predetermined concentration, e.g., $1 \times 10^{16}$ cm$^{-3}$, and the ZnTe layer contains impurities of a predetermined concentration, e.g., $1 \times 10^{18}$ cm$^{-3}$.

The superlattice layer 105 is made of a lamination of ZnO layers 101a, 101b, ..., 101z and ZnTe layers 103a, 103b, ..., 103z, alternately stacked. Each of the ZnO layers 101a, 101b, ..., 101z has preferably a thickness of a two-molecule layer or thicker, e.g., a thickness of a ten-molecule layer. Each of the ZnTe layers 103a, 103b, ..., 103z has a thickness of, e.g., a one-molecule layer, preferably a critical film thickness or thinner. On the ZnO substrate, a ZnO buffer layer may be formed on which the superlattice layer 105 is grown. The total thickness of the superlattice layer 105 is, for example, about 100 nm.

Figure 3A:
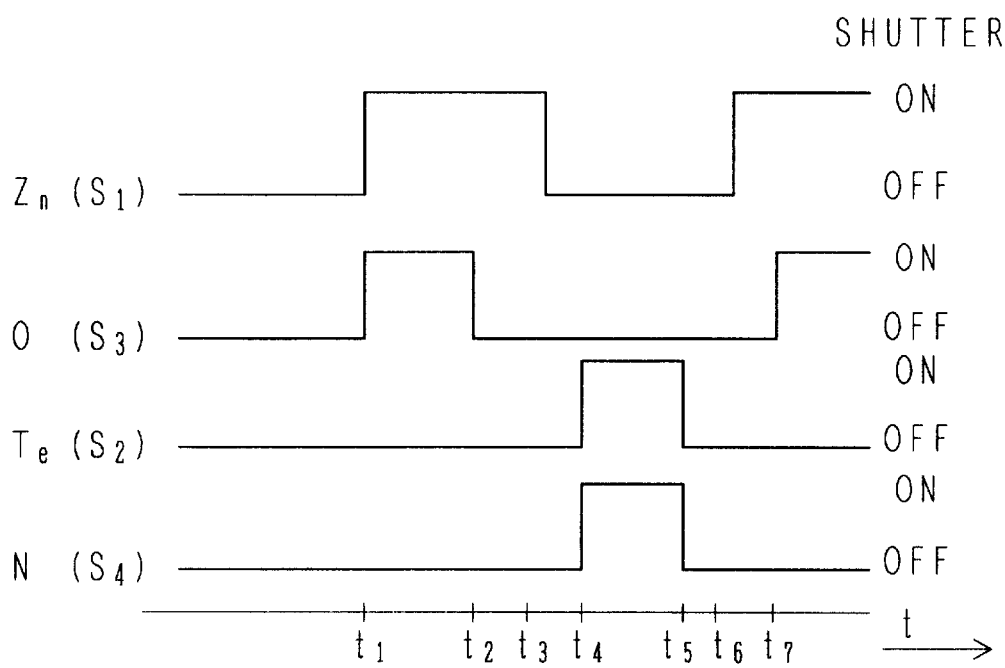
FIGS. 3A and 3B are timing charts showing the shutter control sequences of crystal growth methods of the first embodiment.
Figure 3B:
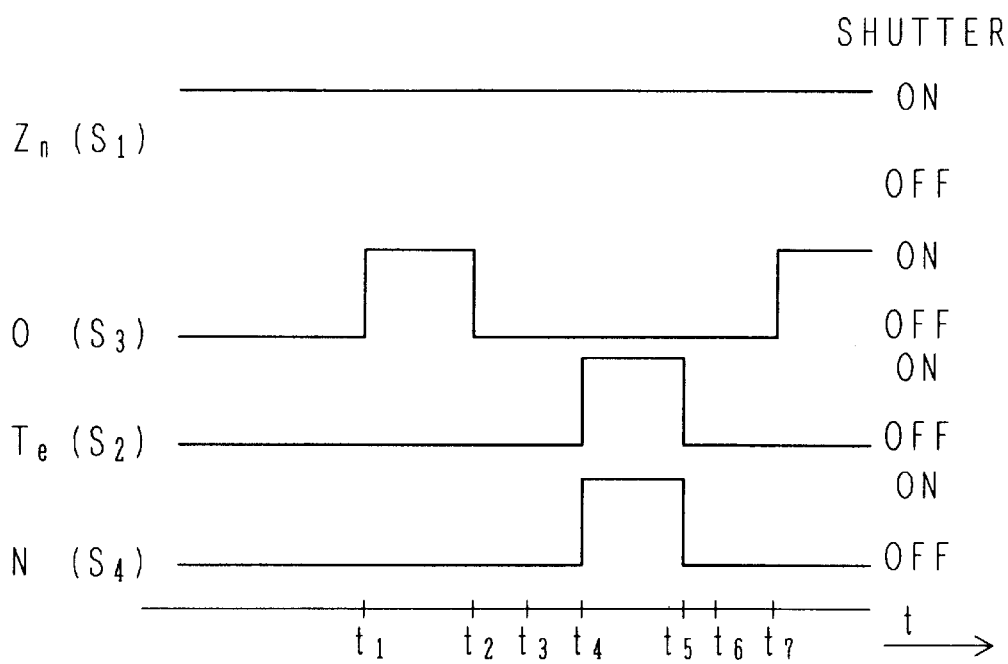

FIGS. 3A and 3B illustrate two growth processes of growing ZnO crystal layers shown in FIG. 2, as open/close sequences of the shutters $S_1$ to $S_4$. Of the two growth processes, the growth process shown in FIG. 3A is called a first growth process, and the growth process shown in FIG. 3B is called a second growth process.

Referring to FIG. 3 showing the first growth process, the shutter $S_1$ for Zn and the shutter $S_3$ for O are opened at time $t_1$. Zn and O elements fly onto the surface of the substrate 100 and a ZnO crystal layer is grown. By controlling the growth parameters such as a Zn supply amount and an O supply amount, ZnO crystals are grown in the unit of a molecule layer.

In this specification, a one-molecule layer means a crystal unit constituted of a Zn one-atom layer and an O one-atom layer. Until a crystal layer having a thickness of a ten-molecule layer is grown, the shutters $S_1$ and $S_3$ are maintained open.

The shutter $S_3$ for O is closed at time $t_2$ to stop a supply of $O_2$ elements until time $t_3$ and supply only Zn elements. Since only Zn elements are supplied, the uppermost surface of the non-doped ZnO layer 101a is formed with a Zn-terminating surface. In order to remove excessive Zn elements, all the shutters are closed during a period from $t_3$ to $t_4$. At time $t_4$, the shutter $S_2$ for Te and the shutter $T_4$ for N are opened to supply Te and N elements to the Zn-terminating surface. Te and N elements are coupled with the Zn-terminating surface so that an N-doped ZnTe layer having a thickness of a one-molecule layer is grown.

The RHEED pattern of the ZnTe layer is (2×1) at time $t_4$ which shows a state of Te rich.

All the shutters are closed during a period from $t_5$ to $t_6$ to remove and degas surplus atoms. Thereafter, the shutter $S_1$ for Zn is opened again to adjust the terminating surface of ZnTe and change the surface of Te rich to a surface of Zn rich. The surface morphology and characteristics can therefore be improved.

Next, the shutter $S_3$ for O is opened at time $t_7$ to again grow ZnO. This state is same as the state at time $t_1$. The above processes are repeated 30 times.

With these processes, p-type ZnO crystals shown in FIG. 2 can be grown.

The outline of the second growth process shown in FIG. 3B will be described.

The shutter $S_1$ for Zn is opened to continuously supply Zn elements to the substrate. The shutter $S_3$ for O is opened at time $t_1$ to supply O elements and grow ZnO elements not doped with impurities to a desired concentration.

The shutter $S_3$ for O is closed at time $t_2$ to stop a supply of O elements. Thereafter, the shutter $S_2$ for Te and shutter $S_4$ for N are opened at time $t_4$ to supply Te and N elements and grow a ZnTe layer doped with N.

The shutters $S_2$, $S_3$ and $S_4$ are closed during a period from $t_5$ to $t_6$ to adjust the terminating surface of ZnTe.

Next, the shutter $S_3$ for O is opened at time $t_7$ to again grow ZnO. This state is same as that at time $t_1$. The above processes are repeated 30 times.

If the ZnO buffer layer 101 is formed as in the first growth process, Zn and O are supplied to the substrate 100 in advance to grow a ZnO layer having a desired thickness, and thereafter the above-described processes are performed.

The superlattice layer has a ratio of ZnO of a ten-molecule layer to ZnTe of a one-molecule layer, after the completion of each of the first and second growth processes. The bandgap of the laminated superlattice layer is approximately equal to that of ZnO.

ZnTe exhibits p-type conductivity as N impurities are doped. Impurity diffusion and hole motion from the N-doped ZnTe layer to the ZnO layer occur over the whole thickness of the ZnO ten-molecule layer.

The ZnO/ZnTe superlattice layer grown in the above manner exhibits p-type conductivity as a whole.

The thickness of ZnTe was set to a one-molecule layer. This thickness is a critical film thickness or thinner so that strain to be generated in the grown layer can be suppressed to a small amount. The surface morphology of the grown layer can be made good.

As a flow rate of N during growth of ZnTe is set to 0.05 ccm under the above-described conditions, the dope amount of N into ZnTe can be suppressed to $1 \times 10^{20}$ cm$^{-3}$.

The concentration of impurities (N) entered in ZnO through diffusion or the like is preferably suppressed lower than the concentration of impurities (N) doped in ZnTe.

Figure 4:
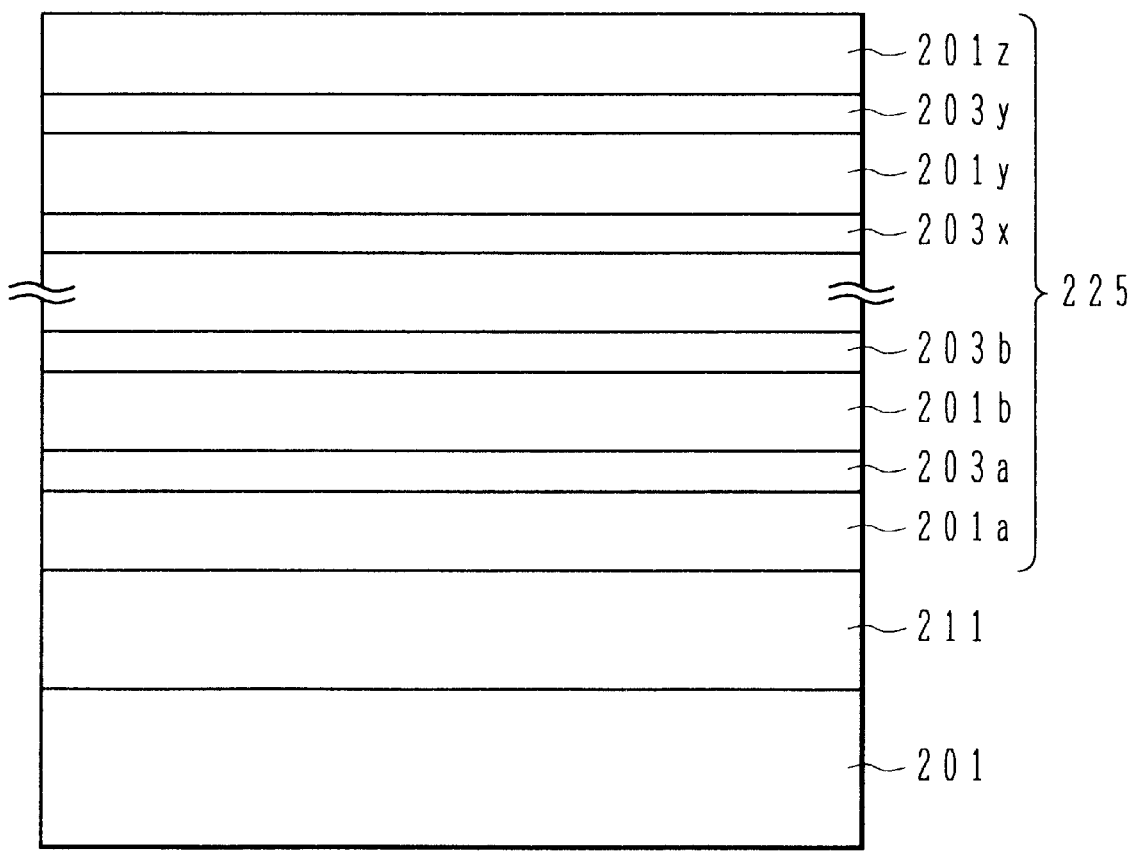
FIG. 4 is a cross sectional view showing the superlattice structure of ZnO—N-doped ZnTe grown by a crystal growth method according to a second embodiment.

FIG. 4 is a cross sectional view showing the structure of p-type semiconductor using ZnO/ZnTe superlattice according to the second embodiment of the invention.

On a sapphire substrate 201, a ZnO layer 211 is grown to a thickness from 30 nm to 100 nm, e.g., 50 nm at a low temperature from 300° C. to 500° C., e.g., 400° C. The ZnO layer 211 grown at a low temperature has initially an amorphous state. The substrate is thereafter gradually heated. This heating progresses crystallization so that the ZnO layer grown at the low temperature changes to an epitaxial ZnO layer.

Next, a superlattice layer 225 of ZnO and N-doped ZnTe is grown to a total thickness of 100 nm by the growth method similar to the growth method of the first embodiment.

In the crystalline structure shown in FIG. 4, the grown superlattice layer 225 has ZnO layers 201$a$, 201$b$, ..., 201$z$ and N-doped ZnTe layers 203$a$, 203$b$, ..., 203$y$ alternately laminated on the low temperature grown ZnO layer 211 formed on the sapphire substrate 201.

Since the low temperature grown ZnO layer 211 is intervened between the sapphire substrate 201 and superlattice layer 225, strain to be caused by a lattice coefficient difference between the sapphire substrate 201 and superlattice layer 225 can be relaxed. The surface morphology can be improved.

According to the above-described group II-VI compound semiconductor growth method, it is possible to grow p-type ZnO crystals having good crystallinity and low electrical resistance.

Figure 5:
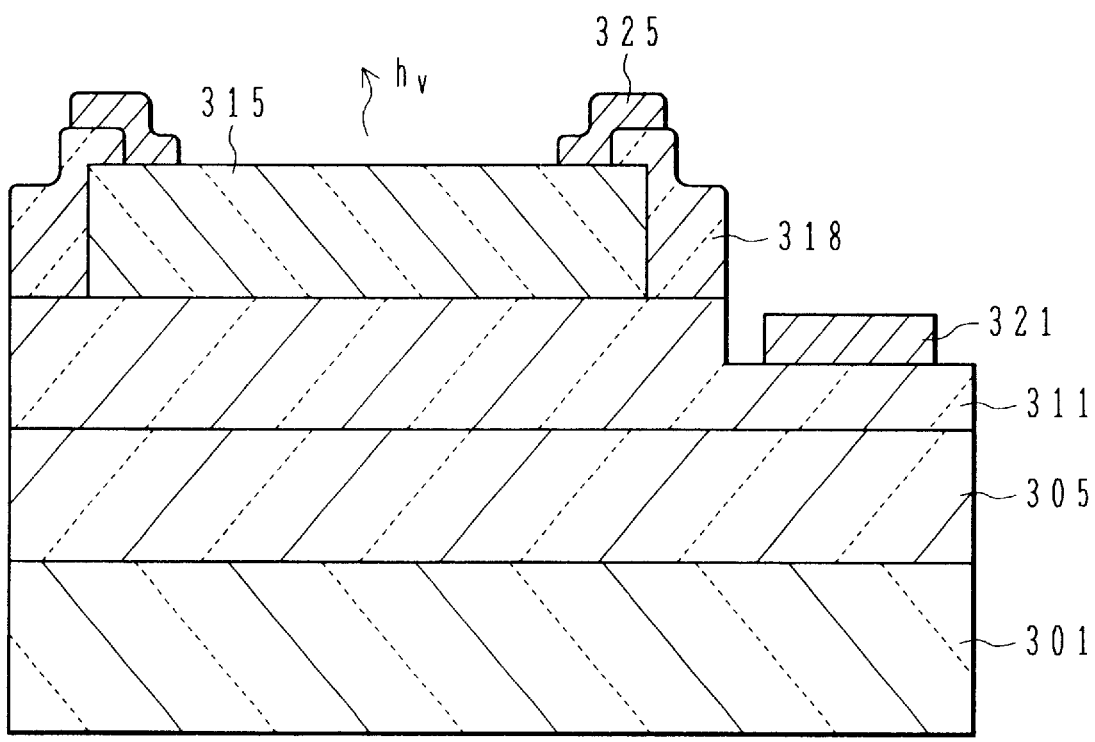
FIG. 5 is a cross sectional view showing the structure of an LED device having a p-n junction diode using as p-type semiconductor a superlattice of ZnO—N-doped ZnTe grown by the crystal growth method of the second embodiment.

FIG. 5 is a cross sectional view showing the structure of an LED (Light Emitting Diode) having a p-n junction and formed by using n-type Ga-doped ZnO and by using superlattice made of ZnO—N-doped ZnTe as p-type semiconductor.

As shown in FIG. 5, LED has a sapphire substrate 301, a non-doped ZnO buffer layer 305 grown at a low temperature and having a thickness of 100 nm, an n-type (Ga doped: $1 \times 10^{18}$ cm$^{-3}$) ZnO layer 311 formed on the layer 305 and having a thickness of 100 nm, and a superlattice layer 315 (total thickness of about 100 nm) formed on the layer 311 and made of 30 layers of ZnO and N-doped ZnTe alternately laminated.

The n-type ZnO layer 311 is made in contact with a first electrode 321.

The n-type ZnO layer may be formed by doping other group III elements such as Al instead of doping Ga.

The superlattice layer 315 is patterned to an island shape. The superlattice layer 315 patterned to the island shape has its outer peripheral area covered with an insulating film 318 made of, for example, SiN. An opening having a shape of, for example, an approximately circular shape, is formed through the insulating film 318 to expose the upper surface of the superlattice layer 315. The insulating film 318 covers and protects at least the side wall of the island-patterned superlattice layer 315.

A second electrode 325 having an opening, for example, a ring electrode, is formed on the upper circumferential area of the superlattice layer 315. The lower surface on the inner circumferential side of the ring-shaped second electrode 325 is in contact with the upper circumferential surface of the superlattice layer 315. The outer circumferential side of the second electrode rides on the insulating film 318.

With this structure, as a positive voltage is applied to the second electrode 325 relative to the first electrode 321, a forward current flows through the p-n junction. Minority carriers (electrons) injected into the p-type superlattice layer 315 and majority carriers (holes) in the p-type super lattice layer 315 are recombined radiatively. When electrons and holes recombine, light having an energy approximately equal to an energy gap of the forbidden band is radiated from the above-described opening. Namely, electric energy is converted into optical energy.

With the above-described operation, light having a wavelength of about 370 nm is emitted from the opening of LED. Although this LED has the p-type superlattice layer as the optical surface (light emission surface), it is obvious that it may have an n-type superlattice layer as the optical surface (light emission surface).

In this embodiment, LED is used as an example of a semiconductor device using a p-n junction between the p-type superlattice layer 315 (ZnO and N-doped ZnTe) and the n-type ZnO. Obviously, a laser device by using a combination of the p-type superlattice layer 315 and n-type ZnO may be formed. It is also obvious that a combination with the p-type superlattice layer 315 can manufacture electronic devices such as FETs and bipolar transistors, other optical devices, and semiconductor devices made of a combination of these devices.

The present invention has been described in connection with the preferred embodiments. The invention is not limited only to the above embodiments. For example, the thickness of each thin film constituting the superlattice layer may be changed as desired so long as desired characteristics can be satisfied. The gas supply sequences are not limited to those described above. The growth conditions and other process parameters can be selected in various ways. It is apparent that various modifications, improvements, combinations, and the like can be made by those skilled in the art.

What is claimed is:

1. A p-type group II-VI compound semiconductor crystalline material, comprising:
   a lamination structure of ZnO layers and ZnTe layers alternately stacked on a substrate, wherein N is doped at least in the ZnTe layer.

2. A p-type group II-VI compound semiconductor crystalline material according to claim 1, wherein the ZnO layer is doped with N at a lower concentration than an N concentration doped in the ZnTe layer.

3. A p-type group II-VI compound semiconductor crystalline material according to claim 1, further comprising a ZnO layer grown at a low temperature formed between the lamination structure and the substrate.

4. A group II-VI compound semiconductor device comprising:
   a substrate;
   an n-type group II-VI compound semiconductor layer doped with group III elements and formed on the substrate; and
   a p-type group II-VI compound semiconductor layer formed on the substrate and having ZnO layers and ZnTe layers alternately laminated, N being doped at least in the ZnTe layer.

5. A group II-VI compound semiconductor device according to claim 4, further comprising:
   a first electrode electrically connected to said n-type group II-VI compound semiconductor layer; and
   a second electrode electrically connected to said p-type group II-VI compound semiconductor layer.

6. A group II-VI compound semiconductor device according to claim 5, wherein an opening is formed through one of said first and second electrodes to expose a surface of said n-type or p-type group II-VI compound semiconductor layers.

7. A group II-VI compound semiconductor device according to claim 4, further comprising a ZnO layer grown at a low temperature in contact with the substrate.

8. A group II-VI compound semiconductor device according to claim 5, further comprising a ZnO layer grown at a low temperature in contact with the substrate.

9. A group II-VI compound semiconductor device comprising:
   a substrate;
   an n-type group II-VI compound semiconductor layer doped with a group III element and disposed above the substrate; and
   a p-type group II-VI compound semiconductor laminate disposed above the substrate, and including alternately laminated ZnO layers and ZnTe layers, the ZnTe layers being doped with N, and the ZnO layers not being doped with N, a concentration of N in the ZnO layers by diffusion being less than the concentration of N in the ZnTe layers doped with N.

10. A method of growing p-type group II-VI compound semiconductor crystals according to claim 7 comprising:
    forming ZnO layers and ZnTe layers alternately above a substrate, the ZnO layers not being doped with impurities and having a predetermined impurity concentration, and doping the ZnTe layers with p-type impurities N to a predetermined impurity concentration or higher.

11. A method of growing p-type group II-VI compound semiconductor crystals according to claim 1, wherein each ZnTe layer is grown to a thickness of a critical film thickness or thinner.

12. A method of growing p-type group II-VI compound semiconductor crystals according to claim 1, wherein each ZnO layer is grown to a thickness of a two-molecule layer or thicker.

13. A method of growing p-type group II-VI compound semiconductor crystals according to claim 1, wherein:
    a process of forming the ZnO layer comprises the steps of:
    (a) supplying Zn and O elements to the substrate;
    (b) after said step (a), stopping a supply of O elements; and
    (c) after said step (b), stopping a supply of Zn elements to remove excessive Zn elements above the substrate; and
    a process of forming the ZnTe layer comprises the steps of:
    (d) after said step (c), supplying Te and N elements; and
    (e) after said step (d), stopping a supply of Te and N elements to the substrate to intercept crystal growth on the substrate.

14. A method of growing p-type group II-VI compound semiconductor crystals according to claim 4, further comprising the steps of:
    (f) after said step (e), supplying Zn elements to the substrate; and
    (g) after said step (f), supplying O elements to the substrate.

15. A method of growing p-type group II-VI compound semiconductor crystals according to claim 1, wherein:
    a process of forming the ZnO layer comprises, in a state that Zn elements are supplied to the substrate, the steps of:
    (a) supplying O elements to grow the ZnO layer not doped with impurities and having the predetermined impurity concentration; and
    (b) after said step (a), stopping a supply of O elements; and
    a process of forming the ZnTe layer comprises the steps of:
    (c) after said step (b), supplying Te and N elements to grown the ZnTe layer doped with N.

* * * * *